United States Patent [19]
Bettin

[11] 4,159,483
[45] Jun. 26, 1979

[54] LOW PROFILE FORCE INDICATING FASTENER, ESPECIALLY FOR SEMICONDUCTOR CLAMPS

[75] Inventor: Carl J. Bettin, Menomonee Falls, Wis.

[73] Assignee: Cutler-Hammer, Inc., Milwaukee, Wis.

[21] Appl. No.: 854,800

[22] Filed: Nov. 25, 1977

[51] Int. Cl.² .................. H01L 23/42; H01L 23/44; H01L 23/46
[52] U.S. Cl. .................................... 357/79; 357/81; 85/62
[58] Field of Search .................. 357/79, 81; 165/80; 85/62

[56] References Cited

U.S. PATENT DOCUMENTS

| | | | |
|---|---|---|---|
| 2,188,356 | 1/1940 | Jeans | 85/62 |
| 3,323,403 | 6/1967 | Waisman | 85/62 |
| 3,405,597 | 10/1968 | Elsner et al. | 85/62 |
| 3,786,168 | 1/1974 | Jaecklin et al. | 357/79 |
| 3,948,141 | 4/1976 | Shinjo | 85/62 |
| 4,020,734 | 5/1977 | Bell | 85/62 |
| 4,072,081 | 2/1978 | Curtis et al. | 85/62 |

FOREIGN PATENT DOCUMENTS 1193771  6/1970  United Kingdom ............. 85/62

OTHER PUBLICATIONS

Wakefield Semiconductor Heat Sink and Thermal Products Distributor Products Catalog, No. 102, p. 6; 8/1973.

Primary Examiner—Andrew J. James
Attorney, Agent, or Firm—Hugh R. Rather; William A. Autio; Michael E. Taken

[57] ABSTRACT

A low profile semiconductor clamp with force indicating means is disclosed. A resiliently compressive spring washer, such as a belleville, is incentrically disposed within and bowed above an annularly larger indicator washer. The washers rest on a base member to which a clamping force is to be applied by tightening a nut down on a threaded stud extending freely up through the base member and the washers. A load washer is disposed between the nut and the spring washer. In unclamped condition, the load washer rests on the spring washer and hence is spaced above the indicator washer, whereby the indicator washer may be freely manually rotated about the stud. Upon tightening the nut, the load washer compresses the spring washer until the load washer engages the indicator washer to impede manual rotation thereof due to its frictional binding between the load washer and the base member. Engagement of the indicator washer by the load washer corresponds to a certain vertical deflection of the spring washer which in turn corresponds to a certain loading force, whereby frictionally retarded rotation of the indicator washer affords an indication that the desired loading force has been attained.

10 Claims, 4 Drawing Figures

LOW PROFILE FORCE INDICATING FASTENER, ESPECIALLY FOR SEMICONDUCTOR CLAMPS

BACKGROUND OF THE INVENTION

Threaded fasteners with force indication means are known in the art, including their use in semiconductor clamping arrangements wherein a semiconductor disc is clamped between a pair of heat sinks to a prescribed clamping or loading force. These prior fasteners and/or clamping arrangements suffer one or more disadvantages, such as complexity of design, high cost, large number of parts, specially formed parts, modes of indication which may be undesirable or indiscernible in certain applications, and high profile which wastes space in a stacked array. The latter disadvantage is further significant in forced air ventilation systems because the increased amount of open or dead space resulting from high profile increases the volume of air which must be moved and, to maintain the requisite velocity of air flow past the cooling fins of the heat sinks, higher output fans must be used; this being an energy inefficient system. While these prior fasteners and/or clamps have been useful for their intended purposes, the present invention relates to improvements thereover.

SUMMARY OF THE INVENTION

An object of the invention is to provide a simple, low cost, effective fastener with force indication.

Another object is to provide a fastener of the above-mentioned character which is especially suitable for semiconductor clamps.

Another object is to provide a semiconductor clamp affording not only force indication but also low profile to minimize open or dead space when used in a stacked array whereby to enhance the efficiency of forced ventilation and reduce energy consumption by enabling usage of smaller output fans.

Another object is to provide a clamp of the aforementioned character providing force indication in the mode of manual feel whereby it may be used in applications where an indicator is not visually accessible or discernible.

Other objects and advantages will hereinafter appear.

DESCRIPTION OF THE PREFERRED EMBODIMENT

Figure 1:
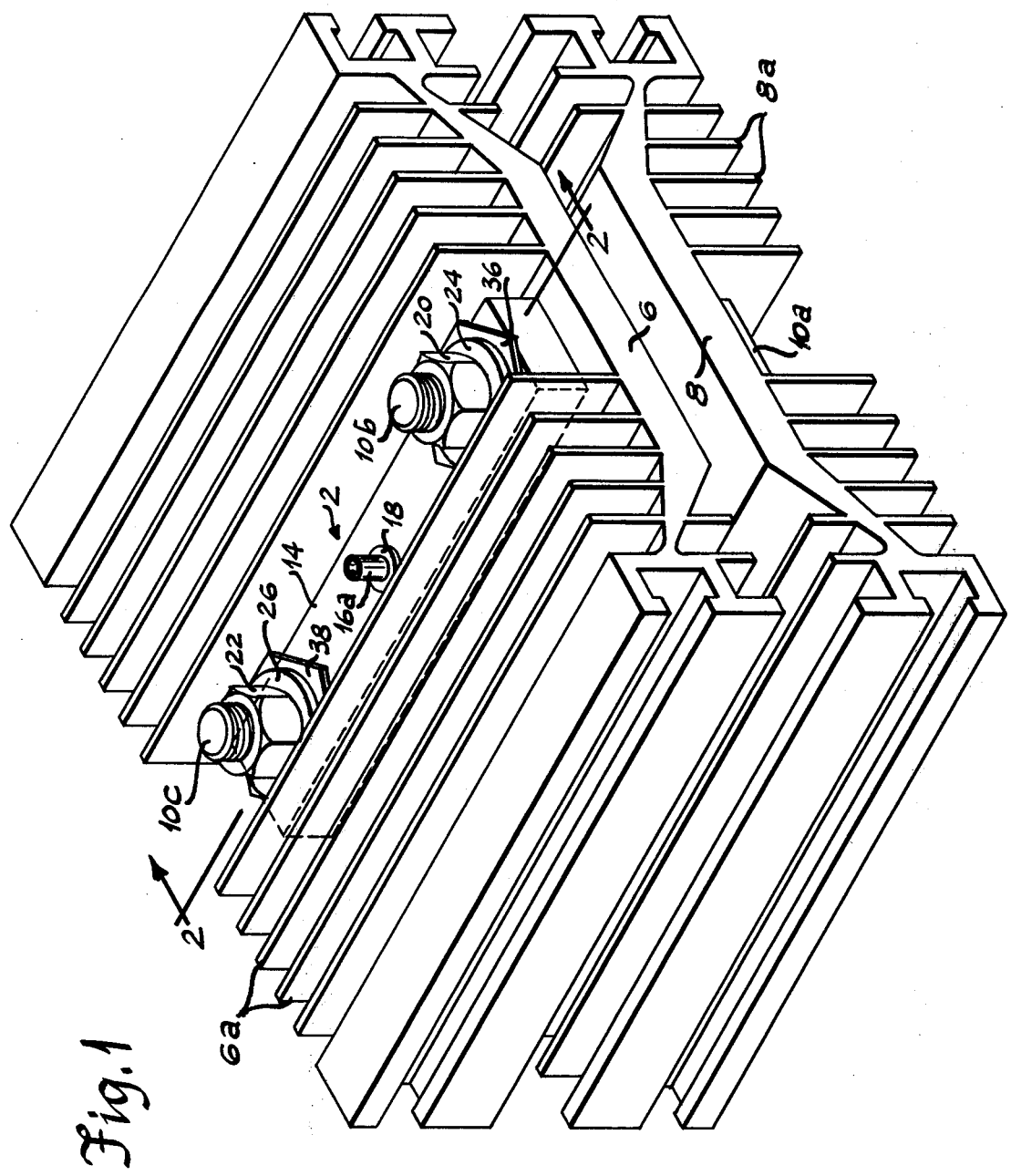
FIG. 1 is an isometric view of a semiconductor clamp in combination with low profile heat sinks.
Figure 2:
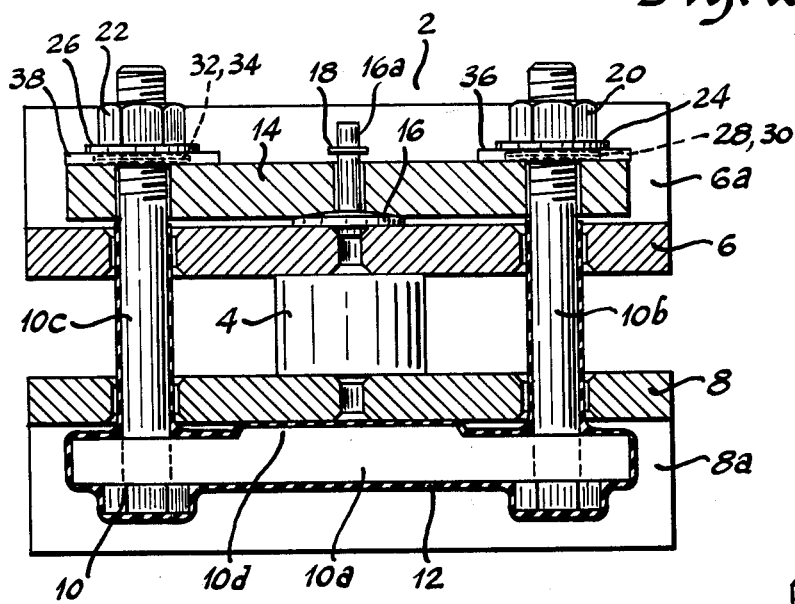
FIG. 2 is a cross-sectional view taken along line 2—2 of FIG. 1.

There is shown in FIG. 1 a semiconductor clamp, generally designated by the reference numeral 2, clamping a semiconductor disc, such as a thyristor 4, FIG. 2, between a pair of low profile heat sinks 6 and 8 having a plurality of cooling fins 6a and 8a, respectively.

The clamp comprises a generally U-shaped integral member 10, FIG. 2, having a bight portion 10a and a pair of upstanding legs or studs 10b and 10c threaded near the top thereof. The frame is coated with insulating material 12 up to the threaded segments of the studs or as required for proper electrical insulation. The clamp also comprises a cross-bar or base member 14. Studs 10b and 10c extend up freely through apertures in heat sinks 6 and 8 and cross-bar 14.

Cross-bar 14 has a dished out section centrally on the underside thereof in which is disposed a disc 16 having a complementarily shaped topside. The disc has a shaft portion 16a extending freely up through an aperture in the cross-bar. A retaining washer 18 is bound about the top of the shaft for retaining the disc on the cross-bar. Disc 16 has a flat bottom and extends slightly below the bottom of cross-bar 14 to centrally engage heat sink 6. Due to the curved interface of cross-bar 14 and the top of disc 16, and the limited freedom of movement therebetween, engagement pressure is equalized and directed along the central axis through heat sink 6, thyristor 4 and heat sink 8 against central slightly raised portion 10d of the bight of the frame.

Figure 3:
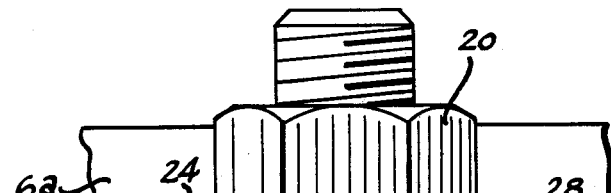
FIG. 3 is an isolated enlarged view of a portion of FIG. 2, showing an unclamped condition.

Clamping force is achieved by turning down threaded nuts 20 and 22 on studs 10b and 10c. Load washers 24 and 26 are disposed loosely around the studs and below nuts 20 and 22. Two pairs of belleville washers, 28, 30 and 32, 34, FIG. 3, are disposed loosely around the studs and below load washers 24 and 26, respectively. The belleville washers rest on cross-bar or base member 14 at their outer periphery and are bowed upwardly at their inner periphery adjacent the studs. Upon tightening of the nuts 20 and 22, the belleville washers are resiliently compressed by load washers 24 and 26, thereby exerting a loading force on base member 14 and hence transmitting clamp pressure to thyristor 4. The greater the vertical deflection of the belleville washers, the greater the clamping force.

A pair of indicator washers 36 and 38 are disposed loosely around the belleville washers and also rest on base member 14. The inner diameter of the indicator washers 36 and 38 is greater than the outer diameter of the belleville washers, even in flattened condition. In relaxed condition, the belleville washers bow above the indicator washers 36 and 38, and thus load washers 24 and 26 are spaced slightly above indicator washers 36 and 38.

Figure 4:
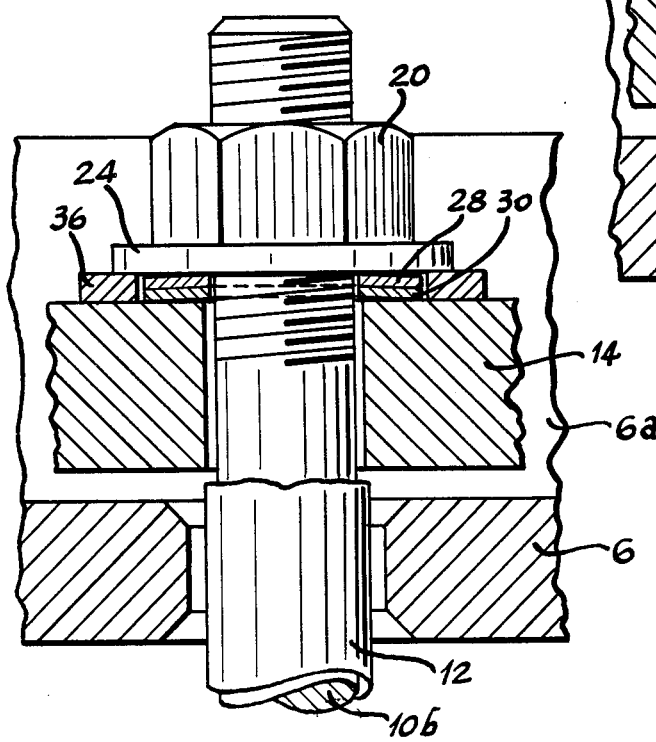
FIG. 4 is similar to FIG. 3, but showing a clamped condition.

FIG. 3 shows a fastener in untightened condition. Load washer 24 rests on bowed belleville washer 28 and 30, and hence is spaced above indicator washer 36 whereby the indicator washer may be freely rotated by hand, thus indicating an untightened condition. Upon turning down of nut 20, the belleville washers are compressed until load washer 24 engages indicator washer 36, FIG. 4, to frictionally pinch the latter against base member 14 to substantially impede manual rotation of the indicator washer, thus indicating a tightened condition.

The vertical height of indicator washer 36 determines the amount of vertical deflection of the belleville washers necessary to close the gap between load washer 24 and indicator washer 36. A given amount of vertical deflection of belleville washers corresponds to a given loading force, in accordance with rating specifications. By thus selecting the appropriately rated belleville washers and the appropriate height indicator washer 36, the desired loading force will be indicated when rotation of the indicator washer 36 is frictionally retarded.

The present invention thus affords both low profile and force indication. Furthermore, it is simple, effective and economical.

The disclosed embodiment is susceptible of numerous modifications, all within the scope of the invention. For example the loading means need not be a stud, nut and load washer, but rather the nut and load washer could be a single integral member; instead of a stud and nut, a threaded screw engaging the belleville washers may be used to effect fastening to a base member. Other types of resiliently compressive biasing washer means may be used instead of belleville washers.

It is necessary that indicator washer 36 engage base 14 with increased pressure to retard rotation of the former upon reaching the desired loading force. It is not necessary, however, that load washer 24 engage indicator washer 36 to impede rotation thereof. For example, the belleville washers could be inverted and may overlap indicator washer 36 such that upon tightening, it is the belleville washers which pinch the indicator washer 36 against base 14. It is the increased engagement pressure between indicator washer 36 and base 14 which is significant.

What is claimed is:

1. A threaded fastener assembly for applying a loading force upon a base member comprising:
   indicator washer means resting on said base member and rotatable about a vertical axis;
   resiliently compressive biasing washer means resting on said base member and extending above said indicator washer means;
   loading means threadably tightenable to vertically compress said biasing washer means against said base member to effect said loading force thereupon;
   such that in response to a predetermined amount of vertical elastic compression of said biasing washer means corresponding to a designated loading force, rotation of said indicator washer means is substantially impeded by frictional retardation thereof by said base member, whereby to afford an indication that the desired loading force has been attained.

2. The invention according to claim 1 wherein said loading means engages said indicator washer means when said biasing washer means is vertically compressed said predetermined amount, whereupon said indicator washer means is frictionally pinched between said loading means and said base member.

3. The invention according to claim 2 wherein said biasing washer means is incentrically disposed within said indicator washer means about said vertical axis.

4. The invention according to claim 3 wherein said biasing washer means is compressed to a vertical height equal to the vertical height of said indicator washer means in response to said designated loading force.

5. A threaded fastener assembly comprising:
   a base member having an aperture;
   indicator washer means resting on said base member coaxial with said aperture;
   resiliently compressive biasing washer means resting on said base member coaxial with said aperture and incentrically disposed within and extending above said indicator washer means;
   a frame member having a threaded stud extending upwardly loosely through said aperture in said base member and said indicator washer means and said biasing washer means;
   nut means matingly threaded on said stud such that in response to tightening of said nut means down on said stud, said nut means vertically elastically compresses said biasing washer means a predetermined amount until said nut means engages said indicator washer means to pinch the latter against said base member to frictionally retard manual rotation of said indicator washer means whereby to afford an indication that said biasing washer means has been compressed said predetermined amount which corresponds to a designated loading force upon said base member.

6. The invention according to claim 5 wherein said biasing washer means is compressed to a vertical height equal to the vertical height of said indicator washer means in response to said designated loading force.

7. The invention according to claim 6 wherein said biasing washer means comprises one or more belleville washers bowed above said indicator washer means, and wherein said nut means comprises a nut threaded on said stud and a load washer resting on said one or more belleville washers below said nut, said indicator washer means being engaged by said load washer in response to said designated loading force compressing said one or more belleville washers said predetermined amount.

8. A clamp comprising:
   a generally U-shaped frame having a pair of upstanding threaded legs;
   a cross-bar member having a pair of apertures at the distal ends thereof through which said legs loosely extend;
   a pair of indicator washers, each resting on said cross-bar member and through which a respective leg loosely extends;
   a pair of resiliently compressive biasing washer means, each resting on said cross-bar member, incentrically disposed within and extending above a respective indicator washer, and through which a respective leg loosely extends;
   a pair of threaded nut means, each threadably cooperable with a respective leg such that upon tightening, said nut means engages said biasing washer means and vertically elastically compresses the latter a predetermined amount corresponding to a designated loading force whereupon said nut means engages said indicator washer to pinch the latter against said cross-bar member whereby to frictionally retard manual rotation of said indicator washer, thus affording an indication that the desired loading force applied through said cross-bar member by said biasing washer means to an object disposed between the bight of said U-shaped frame and said cross-bar member has been attained.

9. A clamp according to claim 8 wherein each said biasing washer means comprises one or more belleville washers bowed above said indicator washer and compressed to a vertical height equal to the vertical height of said indicator washer in response to said designated loading force, and wherein each said nut means comprises a nut threaded on said leg and a load washer resting on said one or more belleville washers below said nut, said indicator washer being engaged by said load washer in response to said designated loading force compressing said one or more belleville washers said predetermined amount.

10. A low profile semiconductor clamping arrangement comprising in combination:
    a generally U-shaped frame having a bight portion from which extend a pair of upstanding threaded legs;
    a pair of spaced heat sinks through which said legs extend, one of said heat sinks being engaged by said bight portion of said frame;

a semiconductor centrally disposed between and engaged by said heat sinks;

a cross-bar member engaging the other of said heat sinks and having a pair of apertures at the distal ends thereof through which said legs extend;

a pair of resiliently compressive biasing washer means, each resting on said cross-bar member and through which a respective leg loosely extends;

a pair of indicator washers, each resting on said cross-bar member and loosely concentrically disposed about a respective said biasing washer means;

each said biasing washer means extending above a respective said indicator washer;

a pair of threaded nut means, each threadably cooperable with a respective said leg such that upon tightening, said nut means engages said biasing washer means and vertically elastically compresses the latter a predetermined amount corresponding to a designated loading force whereupon said biasing washer means is compressed to a vertical height equal to the vertical height of said indicator washer and said nut means engages said indicator washer to pinch the latter against said cross-bar member whereby to frictionally retard manual rotation of said indicator washer, thus affording an indication that the desired loading force has been applied by said biasing washer means through said cross-bar member, said other heat sink, said semiconductor and said one heat sink against said bight portion of said frame.

* * * * *